United States Patent
Riederer et al.

(10) Patent No.: US 6,853,193 B2
(45) Date of Patent: Feb. 8, 2005

(54) SIMULTANEOUS MR DATA ACQUISITION WITH MULTIPLE MUTUALLY DESENSITIZED RF COILS

(75) Inventors: Stephen J. Riederer, Rochester, MN (US); David G. Kruger, Nelson, WI (US); Phillip J. Rossman, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 10/431,935

(22) Filed: May 8, 2003

(65) Prior Publication Data

US 2003/0210048 A1 Nov. 13, 2003

Related U.S. Application Data

(60) Provisional application No. 60/379,450, filed on May 10, 2002.

(51) Int. Cl.$^7$ ................................................. G01V 3/00
(52) U.S. Cl. ........................................ 324/318; 324/322
(58) Field of Search ................................. 324/318, 322, 324/306, 307, 300; 600/421, 422

(56) References Cited

U.S. PATENT DOCUMENTS

| 4,638,253 | A | * | 1/1987 | Jaskolski et al. | ............ 324/311 |
| 4,668,915 | A | * | 5/1987 | Daubin et al. | .............. 324/309 |
| 5,363,845 | A | * | 11/1994 | Chowdhury et al. | ........ 600/422 |

* cited by examiner

*Primary Examiner*—Louis Arana
(74) *Attorney, Agent, or Firm*—Quarles & Brady LLP

(57) ABSTRACT

A method for the simultaneous acquisition of data from two transmit/receive "birdcage" coils is described. The coils are individually RF shielded, making them insensitive to signals generated outside of each coil's volume. Each coil is designed for imaging one leg, and when used together, both legs are imaged simultaneously. In coronal or axial orientations, a small FOV around each leg can be imaged without aliasing. This results in a two-fold scan time reduction compared to a large FOV acquisition with the same spatial resolution.

7 Claims, 4 Drawing Sheets

FIG. 3

SIMULTANEOUS MR DATA ACQUISITION WITH MULTIPLE MUTUALLY DESENSITIZED RF COILS

CROSS-REFERENCE TO RELATED APPLICATIONS

This application claims the benefit of U.S. Provisional patent application Ser. No. 60/379,450 filed on May 10, 2002 and entitled "Simultaneous MR Data Acquisition With Multiple Mutually Desensitized RF Coils".

STATEMENT REGARDING FEDERALLY SPONSORED RESEARCH

This invention was made with government support under Grant No. EB00212 and HL37310 awarded by the National Institute of Health. The United States Government has certain rights in this invention.

BACKGROUND OF THE INVENTION

The field of the invention is nuclear magnetic resonance imaging methods and systems. More particularly, the invention relates to the reduction of scan time when imaging two or more anatomic regions of a subject.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the series of views that are acquired during the scan to produce a set of NMR data from which an entire image can be reconstructed. The number of views that must be acquired for a complete NMR data set is determined by the size of the field of view ("FOV") along the phase encoding gradient axis direction and the prescribed spatial resolution of the desired image along that axis. For a given image resolution, the larger the FOV along the phase encoding axis the larger the number of views that must be acquired and the longer the resulting scan time.

When the anatomy of interest is smaller than the anatomy inside the bore of the MRI system, one can reduce scan time for a given resolution by reducing the FOV to encompass only the anatomy of interest. One difficulty with this strategy is the phenomenon of phase wrap-around or "aliasing" in which anatomy located outside the FOV along the phase encoding axis produces NMR signals that superimpose artifacts into the FOV due to the image reconstruction process. These superimposed image artifacts complicate the image and reduce its clinical value. There are artifact suppression techniques such as "presaturation" for dealing with this problem, but these methods work by suppressing all signals from outside the FOV.

There are a number of clinical applications in which images are acquired from two distinct regions of the anatomy. For example, it is common practice to acquire an MR image from both legs of a subject during a single scan. Such methods typically employ a local receiver coil for each leg, but because of the aliasing problem discussed above, a single, large FOV that includes both legs is prescribed. Aliasing artifacts caused by the other leg cannot be suppressed using presaturation in this situation because the other leg is also being imaged at the same time. As a result, the prescribed FOV must be much larger than the anatomy of interest in order to avoid aliasing artifacts. This substantially increases total scan time because more views are required for the larger FOV.

The use of separate coils for imaging separate fields of view has been studied previously J. S. Hyde, et al., J. Magn. Respectively. 70, 512–517 (1986), Y. Li et al., Anal. Chem. 71, 4815–4820 (1999). However, in these works the efficiency improvement was due to multiplexing the data from multiple coils into a single receiver channel. More recently SENSE, K. P. Pruessman, et al., Magn. Reson. Med. 42, 952–962 (1999), methods allow reduced FOV and reduced acquisition time using known, measured, non-zero coil sensitivity functions.

SUMMARY OF THE INVENTION

The present invention is a method and system for acquiring two separate images from separate FOVs using two, shielded transmit/receive local coils. By shielding each local coil it is rendered insensitive to NMR signals produced by anatomy outside its local FOV. The scan prescription can thus be set to acquire separate images from each of the local coil FOVs without producing aliasing artifacts from anatomy in the other local coil.

An object of the invention is to acquire separate images from each of a subject's two legs in a scan time that is significantly less than the acquisition of a single image of both legs. Because the local spatial sensitivity of each local coil is much smaller than the FOV that encompasses both legs, the scan can be performed with fewer phase encoding views for a given image resolution. For example, the transverse FOV in the phase encoding direction to acquire both legs in a single image may be 40 cm, whereas the FOV of each local coil image according to the present invention may only be 22 cm. Scan time is proportionately reduced, and in this example, is cut nearly in half for a given image resolution.

Another object of the invention is to acquire two images from a pair of shielded local coils. This is achieved by using each local coil in both the RF transmit and RF receive mode of the acquisition. During the receive mode, each local coil connects to a separate receiver and separate sets of image data are acquired from which separate images from the respective coil FOVs are reconstructed.

DESCRIPTION OF THE PREFERRED EMBODIMENT

Figure 1:
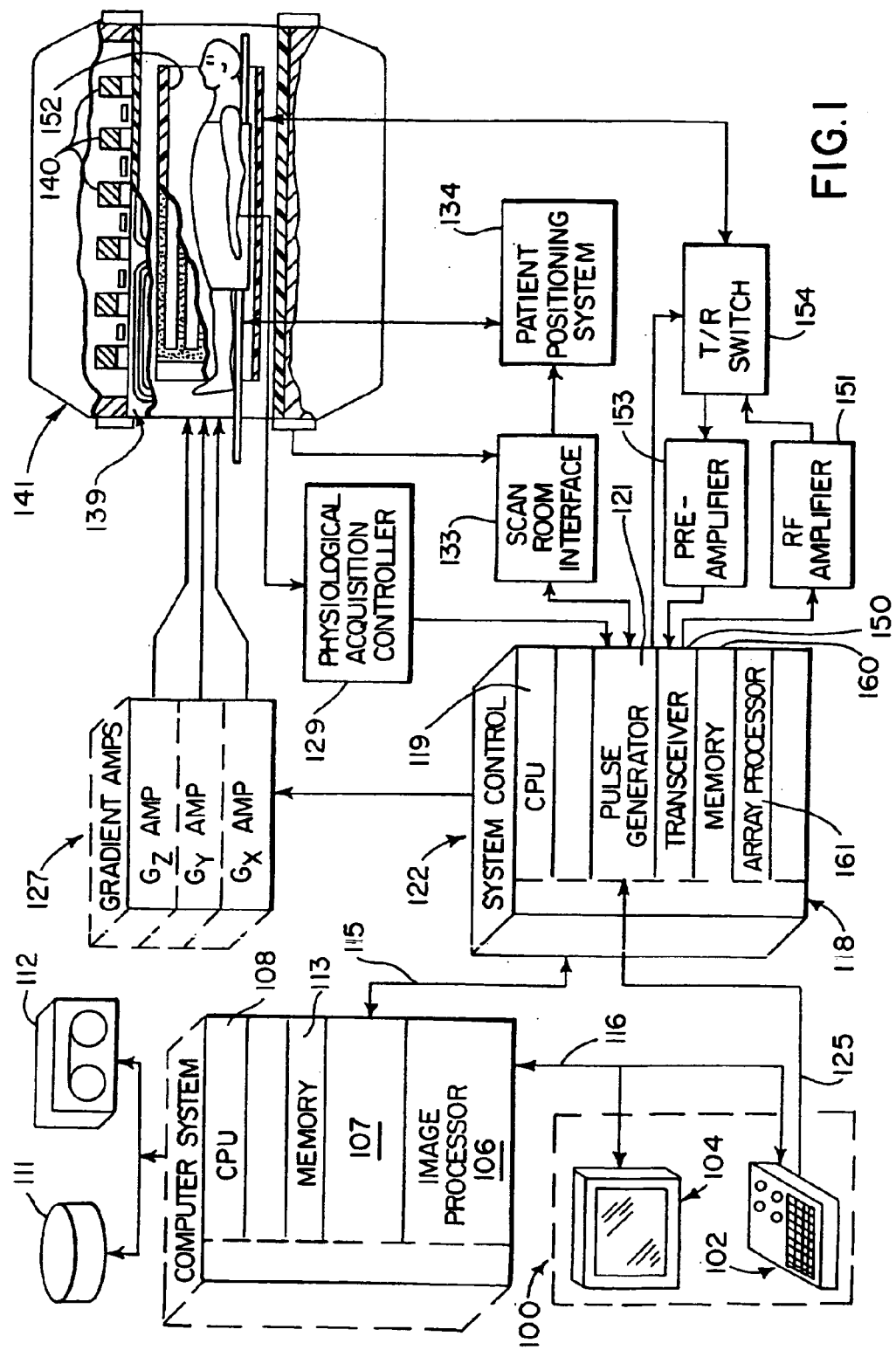
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces RF pulses which are amplified by an RF amplifier 151 and coupled to the RF coil 152 by a transmit/receive switch 154. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode.

In the preferred embodiment of this invention the whole body coil 152 is not used during either the transmit mode or the receive mode. Instead, two local coils 155 and 156 are used. These local coils 155 and 156 are described in more detail below with respect to FIG. 3, and their connection to the T/R switch 154 is described in more detail below with respect to FIGS. 2 and 4.

The NMR signals picked up by the RF coils are digitized by the transceiver module 150 and transferred to a memory module 160 in the system control 122. When the scan is completed two arrays of k-space data have been acquired in the memory module 160, and an array processor 161 operates to Fourier transform the data into two arrays of image data. This image data is conveyed through the serial link 115 to the computer system 107 where it is stored in the disk memory 111. In response to commands received from the operator console 100, these two images may be archived on the tape drive 112, or they may be further processed by the image processor 106 and conveyed to the operator console 100 and presented on the display 104.

Figure 2:
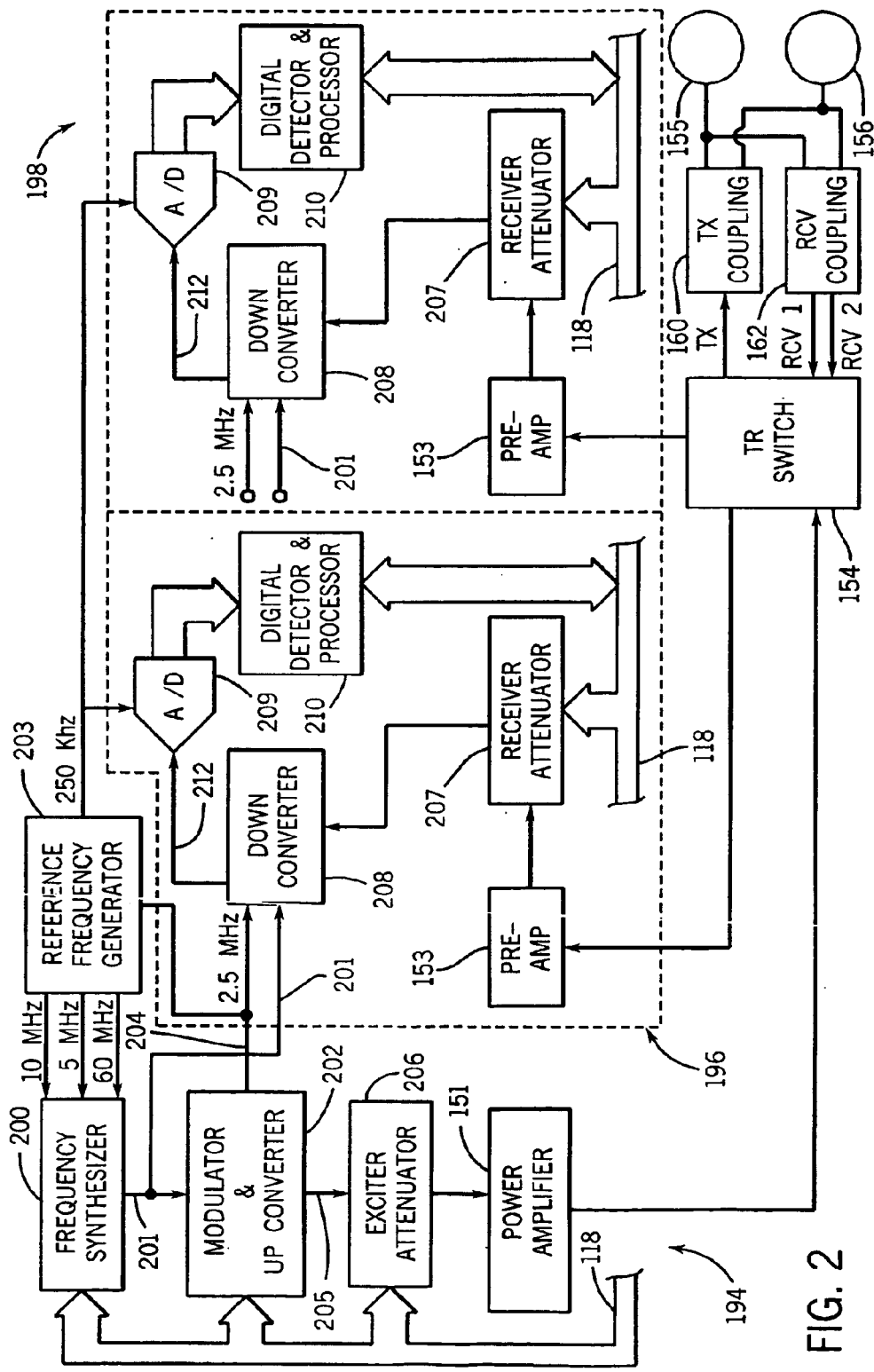
FIG. 2 is a block diagram of a transceiver which forms part of the MRI system of FIG. 1 and its connection through a T/R switch to local coils.

Referring particularly to FIGS. 1 and 2, the transceiver 150 includes a transmitter 194 which produces the RF excitation field $B_1$ in the two local coils 155 and 156, and two receiver channels 196 and 198 that receive the NMR signals detected by the local coils 155 and 156. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal S(t) also received from the pulse generator module 121. The signal S(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that provides the transmit input to the T/R switch 154. When in the transmit mode the RF excitation pulse is applied to a transmit coupling circuit 160 that connects to drive both local coils 155 and 156.

Referring still to FIGS. 1 and 2, the NMR signals detected by each local coil 155 and 156 during the receive mode are applied to a receive coupling circuit 162. The two detected NMR signals are applied to two receiver channel inputs on the T/R switch 154, which couples them to the preamplifier circuits 153 of respective receivers 196 and 198. The respective NMR signal are applied through the preamplifier 153 to the input of a receiver attenuator 207 in its receiver 196 or 198. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHZ reference signal on line 204. The 2.5 MHZ reference signal as well as the 250 KHz sampling signal and the 5, 10 and 60 MHZ reference signals are produced by a reference frequency generator 203 from a common 20 MHZ master clock signal. The down converted NMR signal is applied to the input of an analog-to-digital (A/D) converter 209 which samples and digitizes the analog signal and applies it to a digital detector and signal processor 210 which produces 16-bit-in-phase (I) values and 16-bit-quadrature (Q) values corresponding to the received signal. The resulting stream of digitized I and Q values of the received signals are output through backplane 118 to the memory module 160 where they are employed to reconstruct an image. Two such data streams are produced simultaneously by the coils 155, 156 and their receivers 194 and 196 to acquire two images.

Figure 3:
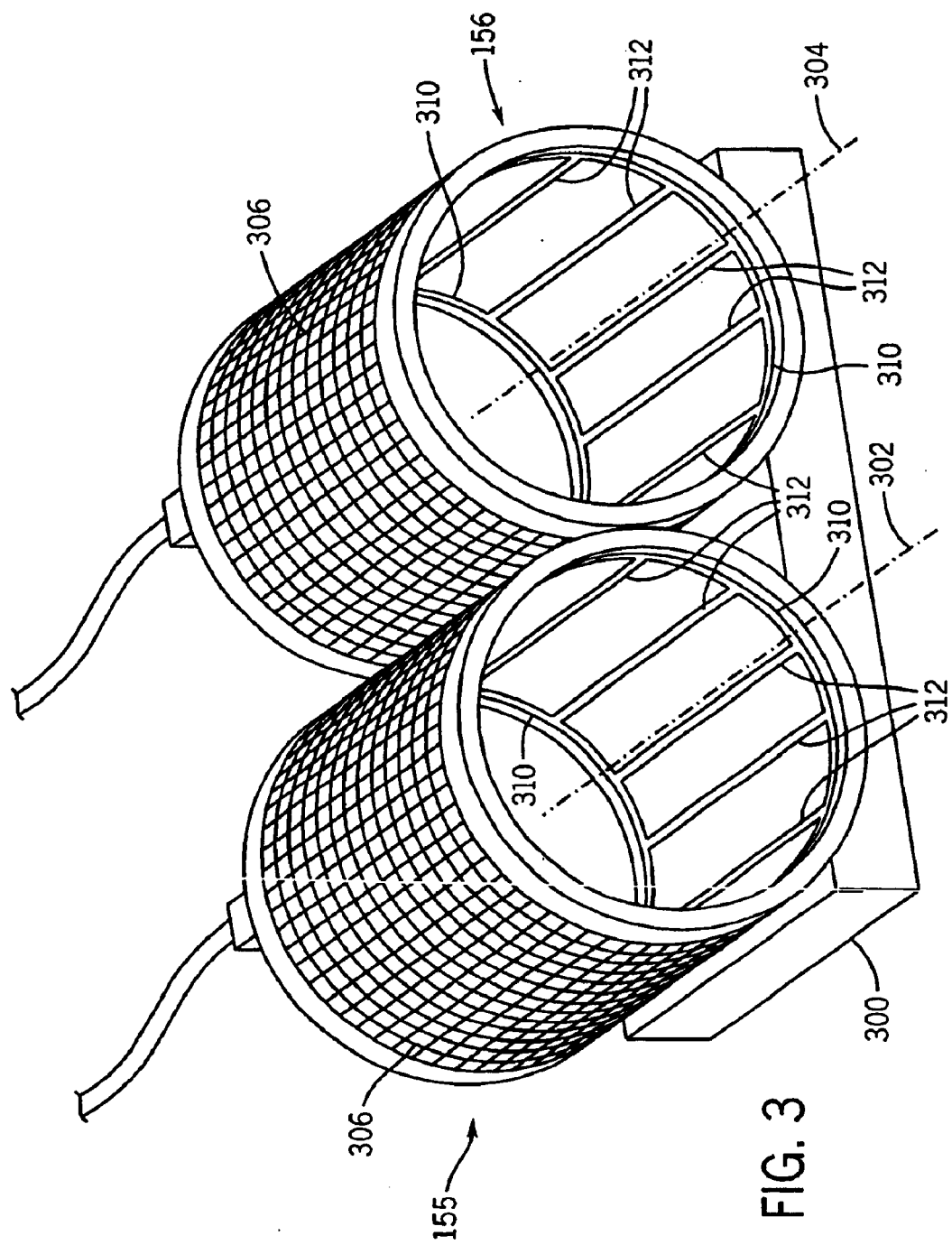
FIG. 3 is a perspective view of a preferred embodiment of local coils used to practice the present invention.

Referring particularly to FIG. 3, the two local coils 155 and 156 are circular cylindrical in shape and are mounted next to each other on a support frame 300. The support frame 300 rests on the patient table of the MRI system and the patient lies on the table with legs extending through parallel openings defined by the local coils 155 and 156. Each opening has a diameter of 20.2 cm and the coils 155 and 156 are spaced approximately 0.5 inches apart. The respective central coil axes 302 and 304 are spaced apart by 26.5 cm.

Each local coil 155 and 156 is a high pass, quadrature, birdcage coil such as that described in U.S. Pat. No. 4,680,548. Each coil has a diameter of 21.5 cm and a length of 31.5, and is formed from 0.25 inch copper tape or a flexible circuit board material applied to the outer surface of a 38.5 cm long acrylic support tube. Each coil 155 and 156 has a conductive ring 310 at each end connected by twelve longitudinal conductors 312 disposed along the coil axis and equally spaced around its circumference to form the well-known birdcage structure.

The local coils 155 and 156 are distinguished by a shield 306 which is wrapped around the outer circumference of each. Each shield is 26 cm in diameter and has an axial length of 34 cm. Each is comprised of a copper screen having an approximate 2 mm screen pitch which is wrapped around a 38.5 cm long acrylic tube having a wall thickness of 0.65 cm and an outside diameter of 25.4 cm. The shield is bonded around its local coil with fiberglass resin. The shields 306 are centered over their respective local coils and overlap them at each end by approximately 1.25 cm. Other shield configurations are possible as long as they allow patient access to the interior, sensitive volume of the local coil and substantially suppress NMR signals produced by spins located outside the local coil.

The shields 306 effectively isolate the receive fields of the two local coils 155 and 156. As a result, NMR signals produced by spins located in one local coil opening are not received by the other local coil. It is due to this RF isolation needed during the receive mode, that the RF excitation applied during the transmit mode must be generated separately by each local coil 155 and 156 as described above. Otherwise, RF excitation produced by the whole body coil 152 would be far from homogeneous inside each local coil opening.

Figure 4A:
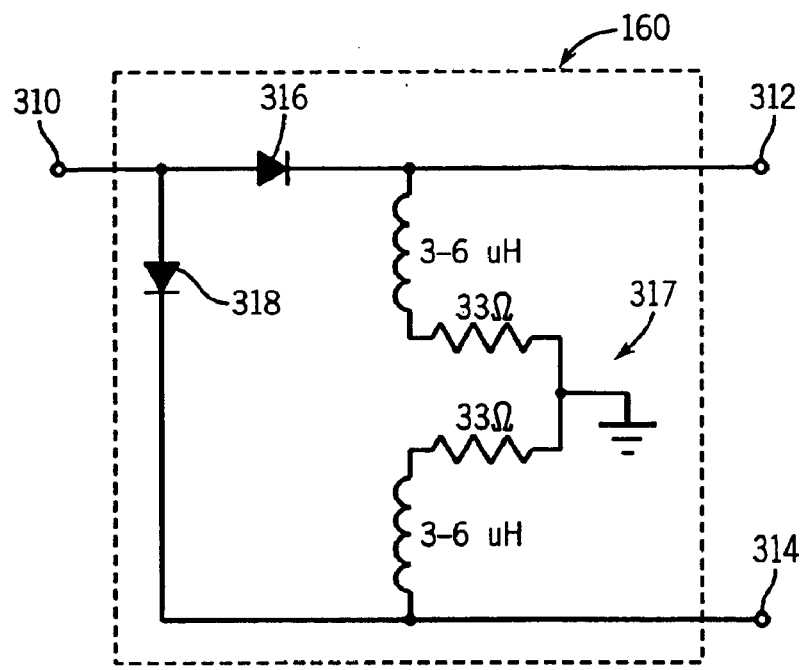
FIGS. 4a and 4b are schematic diagrams of respective transmit and receive coupling circuits which form part of the circuit in FIG. 2.

Referring particularly to FIG. 4a, the transmit coupling circuit 160 enables the RF excitation signal received from the power amplifier 151 at input 310 to be applied equally to respective local coils 155 and 156 through outputs 312 and 314. Signal isolation between the two local coils 155 and 156 during the receive mode is achieved primarily by a pair of diodes 316 and 318 which block signals from either local coil 155 or 156 from coupling back to each other. The coil/resistor network 317 serves as a low-pass filter during the transmit mode to allow DC current to pass through the diodes.

Figure 4B:
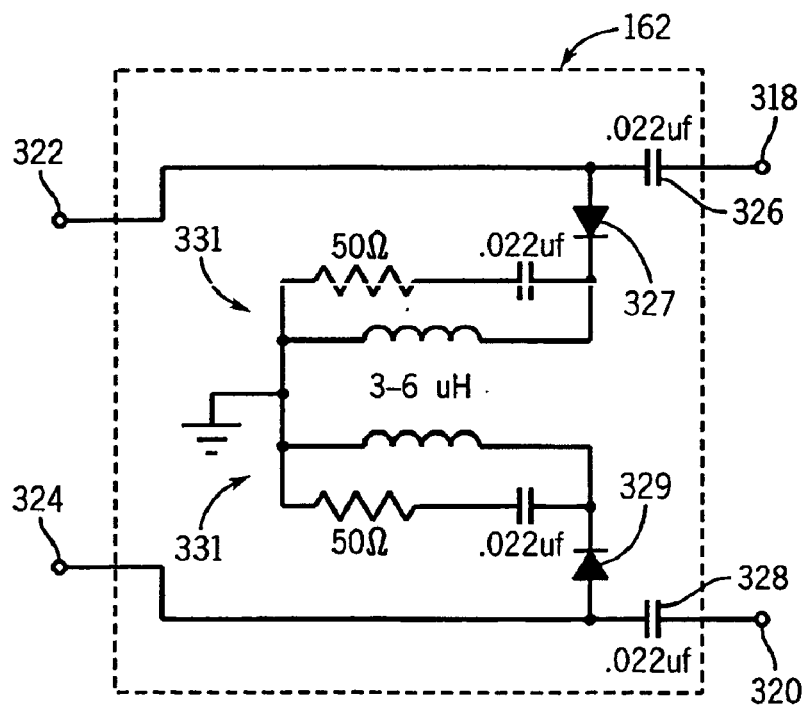

Referring particularly to FIG. 4b, the receive coupling circuit 162 enables the NMR signals detected by each local coil 155 and 156 and produced at inputs 318 and 320 during the receive mode to be applied to the pre-amplifiers 153 in the respective first and second receivers 196 and 198 through outputs 322 and 324. The coupling capacitors 326 and 328 block DC current applied to the circuit during the transmit mode. This current turns diodes 327 and 329 "on" to enable the circuitry 331 to act as an impedance matching load on the receive terminals 318 and 320 during the transmit mode.

The acquisition of NMR image data using the present invention enables the scan time to be reduced for a given resolution. When imaging a patient's knees for example, a spin echo pulse sequence having a prescribed TR of 100 msec might be used to acquire each of N phase encoding views. The phase encoding axis in this example is directed horizontally and perpendicular to the local coil axes 302 and 304. The number of views N required during the acquisition is directly proportional to the size of the prescribed FOV along this lateral direction. Using a conventional scanning technique the FOV needed to see both knees will typically range from 35 to 45 cm, whereas the FOV needed to see one knee will typically range from 20 to 24 cm. In this example, to acquire a single image with a resolution of 1 mm and an FOV of 40 cm along the phase encoding axis will require a scan time:

$$t=TR \times N=40 \text{ sec}$$

where:

$$N=40 \text{ cm}/1 \text{ mm}=400.$$

By using the present invention the FOV is reduced to 22 cm and two smaller images are acquired simultaneously in the following scan time:

$$t=TR \times N=22 \text{ sec}$$

where:

$$N=22 \text{ cm}/1 \text{ mm}=220.$$

It should be apparent that the present invention may be used to advantage in other clinical applications where two or more small regions of interest can be acquired using separate, shielded local coils in lieu of acquiring one much larger region of interest. Also, while scan time is reduced in the above example, scan time can remain unchanged and the image resolution along the phase encoding axis can be increased. This may allow, for example, image resolution to be doubled without increasing scan time.

What is claimed is:

1. A method for acquiring NMR data from multiple objects in the bore of an MRI system, the steps comprising:

positioning a local coil adjacent to each respective object;

shielding each local coil to render it substantially insensitive to NMR signals produced outside a local region containing its associated object;

prescribing an NMR acquisition pulse sequence to simultaneously acquire NMR data from the local region of each local coil; and acquiring a separate image data set from each of said objects by performing the NMR acquisition pulse sequence a plurality of times and simultaneously sampling NMR signals produced by each of the plurality of local coils.

2. The method as recited in claim 1 in which the NMR acquisition pulse sequence includes producing an RF excitation pulse during a transmission mode, and the method further includes applying the RF excitation pulse simultaneously to each local coil to produce an RF excitation field in its adjacent local region.

3. The method as recited in claim 1 in which the prescribed NMR acquisition pulse sequence is repeated a sufficient number of times to acquire NMR data from which an image of a local region can be reconstructed with a prescribed resolution.

4. A local coil assembly for acquiring NMR data from two separate regions of interest simultaneously the combination comprising:

a first local coil disposed adjacent a first of said two regions of interest and being operable to produce an RF excitation field in the first region of interest during a transmit mode and being operable to receive NMR signals produced in the first region of interest during a receive mode;

a second local coil disposed adjacent a second of said two regions of interest and being operable to produce an RF excitation field in the second region of interest during a transmit mode and being operable to receive NMR signals produced in the second region of interest during a receive mode;

a first shield disposed around said first local coil to substantially suppress receipt by the first local coil of NMR signals from outside the first region of interest; and a second shield disposed around said second local coil to substantially suppress receipt by the second local coil of NMR signals from outside the second region of interest.

5. The local coil assembly as recited in claim 4 in which the first and second local coils are cylindrical in shape and surround their respective first and second regions of interest.

6. The local coil assembly as recited in claim 5 in which each local coil is a birdcage coil having a pair of circular conductive rings joined by a set of longitudinal conductors disposed around its circumference.

7. The local coil assembly as recited in claim 4 which includes a support frame to which both local coils and their shields are attached.

* * * * *